(12) United States Patent
Yu et al.

(10) Patent No.: US 11,393,895 B2
(45) Date of Patent: Jul. 19, 2022

(54) ORGANIC LIGHT-EMITTING BACKPLANE AND MANUFACTURING METHOD THEREOF, TOUCH DISPLAY SCREEN AND TOUCH DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Fei Yu, Beijing (CN); Hongjun Zhou, Beijing (CN); Wen Tan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/973,963

(22) PCT Filed: Jun. 28, 2020

(86) PCT No.: PCT/CN2020/098548
§ 371 (c)(1),
(2) Date: Dec. 10, 2020

(87) PCT Pub. No.: WO2021/077789
PCT Pub. Date: Apr. 29, 2021

(65) Prior Publication Data
US 2021/0376035 A1     Dec. 2, 2021

(30) Foreign Application Priority Data

Oct. 23, 2019   (CN) .......................... 201911010902.2

(51) Int. Cl.
*H01L 27/32* (2006.01)
*G06F 3/041* (2006.01)
(Continued)

(52) U.S. Cl.
CPC .......... *H01L 27/3276* (2013.01); *G06F 3/041* (2013.01); *H01L 27/3288* (2013.01);
(Continued)

(58) Field of Classification Search
None
See application file for complete search history.

(56) References Cited

U.S. PATENT DOCUMENTS

2018/0059862 A1    3/2018   Zeng et al.
2018/0239485 A1    8/2018   Shi
(Continued)

FOREIGN PATENT DOCUMENTS

CN    104571696 A    4/2015
CN    106020545 A    10/2016
(Continued)

*Primary Examiner* — Carl Adams
(74) *Attorney, Agent, or Firm* — The Webb Law Firm (57) ABSTRACT

The present disclosure relates to an organic light-emitting backplane and manufacturing method thereof, a touch display screen and a touch display device. The organic light-emitting backplane comprises a display region and a non-display region located around the display region, the organic light-emitting backplane in the non-display region comprising: a first substrate; a padding layer located on a side of the first substrate, the padding layer comprising a body portion and a convex pattern portion located on a side of the body portion away from the first substrate; and a first wiring layer located on a side of the padding layer away from the first substrate, at least apart of the first wiring layer being formed on a surface of the convex pattern portion.

18 Claims, 5 Drawing Sheets

(51) Int. Cl.
  *H01L 51/52*   (2006.01)
  *H01L 51/56*   (2006.01)
(52) U.S. Cl.
  CPC ............ *H01L 51/525* (2013.01); *H01L 51/56*
    (2013.01); *G06F 2203/04103* (2013.01)

(56) References Cited

U.S. PATENT DOCUMENTS

| | | | |
|---|---|---|---|
| 2020/0243637 A1* | 7/2020 | Lee | ................... H01L 51/529 |
| 2020/0411596 A1 | 12/2020 | Guo et al. | |
| 2020/0411615 A1 | 12/2020 | Ding et al. | |
| 2021/0175315 A1* | 6/2021 | Lee | ................... H01L 51/5246 |

FOREIGN PATENT DOCUMENTS

| | | |
|---|---|---|
| CN | 106951125 A | 7/2017 |
| CN | 107887526 A | 4/2018 |
| CN | 109742106 A | 5/2019 |
| CN | 110265459 A | 9/2019 |
| CN | 110265579 A | 9/2019 |
| CN | 110767663 A | 2/2020 |

* cited by examiner

ORGANIC LIGHT-EMITTING BACKPLANE
AND MANUFACTURING METHOD
THEREOF, TOUCH DISPLAY SCREEN AND
TOUCH DISPLAY DEVICE

CROSS-REFERENCE TO RELATED
APPLICATIONS

This application is a U.S. National Stage under 35 U.S.C. § 371 of International Application No. PCT/CN2020/098548, as filed on Jun. 28, 2020, which claims the priority to the Chinese Patent Application No. 201911010902.2 filed on Oct. 23, 2019. The disclosure of each of these applications is incorporated by reference as a whole into the present application.

TECHNICAL FIELD

The present disclosure relates to the technical field of touch display, and particularly to an organic light-emitting backplane and manufacturing method thereof, a touch display screen and a touch display device.

BACKGROUND

At present, a common touch display screen adopts an externally-hung design, that is, the touch screen and the display screen are manufactured separately and then fit together. This technology has defects of higher manufacturing cost, lower light transmittance and thicker module.

With the development of science and technology, the technology of embedded touch display screen (incell) gradually becomes a new research and development favorite, in which the touch structure is embedded into the display screen, so that the touch display screen is thinner and lower in cost.

How to improve the signal transmission performance of the incell to thereby improve touch sensitivity is a technical problem to be solved urgently at present.

SUMMARY

According to an aspect of the embodiments of the present disclosure, there is provided an organic light-emitting backplane comprising a display region and a non-display region located around the display region, the organic light-emitting backplane in the non-display region comprising:
 a first substrate;
 a padding layer located on a side of the first substrate, the padding layer comprising a body portion and a convex pattern portion located on a side of the body portion away from the first substrate; and
 a first wiring layer located on a side of the padding layer away from the first substrate, at least a part of the first wiring layer being formed on a surface of the convex pattern portion.

In some embodiments, the convex pattern portion is an integral connecting structure, or the convex pattern portion comprises a plurality of convex substructures spaced apart.

In some embodiments, the convex pattern portion is in the form of a grid, a coil, or a meander.

In some embodiments, the convex pattern portion comprises a plurality of convex substructures spaced apart, the plurality of convex substructures are arranged in an array, or the plurality of convex substructures are arranged in a concentric nested manner, or the plurality of convex substructures comprises: a first convex substructure located in a center of a virtual square, a second convex substructure located at four vertexes of the virtual square respectively, and a plurality of third convex substructures arranged along four sides of the virtual square, wherein a projected area S1 of the first convex substructure on the first substrate, a projected area S2 of the second convex substructure on the first substrate, and a projected area S3 of the third convex substructure on the first substrate satisfy S1>S2>S3.

In some embodiments, a gap size of the convex pattern portion is less than a minimum recognition accuracy of an exposure machine.

In some embodiments, the non-display region further comprises: a second wiring layer and a planarization layer located between the first substrate and the padding layer and sequentially arranged in a direction away from the first substrate, and the first wiring layer is electrically connected with the second wiring layer through a cross section of the padding layer and a via of the planarization layer.

In some embodiments, the cross section of the padding layer is sloped and includes at least one step surface.

In some embodiments, the cross section of the padding layer is sloped and includes at least two step surfaces, and a gap of orthographic projections of any adjacent step surfaces on the first substrate is equal and less than the minimum recognition accuracy of the exposure machine; widths of the at least two step surfaces are sequentially decreased in a direction close to the via, and a width of the step surface farthest from the via is not greater than the minimum recognition accuracy of the exposure machine.

In some embodiments, the planarization layer further extends to the display region, and the display region includes: an organic light-emitting device located on a side of the planarization layer away from the first substrate, a pixel defining layer configured to space adjacent organic light-emitting devices apart, and a spacer located on a side of the pixel defining layer away from the first substrate; a height of the padding layer is not less than a sum of thicknesses of the pixel defining layer and the spacer.

In some embodiments, a material of the padding layer includes an organic material.

The embodiments of the present disclosure further provide a touch display screen, comprising the organic light-emitting backplane according to any of the foregoing technical solutions, and a touch cover plate stacked on the organic light-emitting backplane, wherein the touch cover plate comprises a third wiring layer in electrical contact with the part of the first wiring layer formed on the surface of the convex pattern portion.

The embodiments of the present disclosure further provide a touch display device, comprising the touch display screen according to the foregoing technical solution.

The embodiments of the present disclosure further provide a method of manufacturing an organic light-emitting backplane, comprising:
 forming a padding layer in a non-display region of a substrate, wherein the padding layer comprises a body portion and a convex pattern portion located on a side of the body portion away from the substrate; and
 forming a wiring layer on a side of the padding layer away from the substrate, wherein at least a part of the wiring layer is formed on a surface of the convex pattern portion.

In some embodiments, that forming a padding layer in a non-display region of a substrate comprises:
 forming an organic material film layer on a side of the substrate;
 exposing the organic material film layer by using a mask plate;

developing the exposed organic material film layer to form the padding layer;

wherein, the mask plate comprises a shading pattern region with a same pattern as the convex pattern portion and an aperture region coupled with the shading pattern region, and an aperture width of the aperture region is smaller than a minimum recognition accuracy of an exposure machine.

In some embodiments, the mask plate further comprises a plurality of strip-shaped shading regions and a plurality of strip-shaped aperture regions alternately arranged in a direction away from the shading pattern region, wherein:

aperture widths of the strip-shaped aperture regions are equal and smaller than the minimum recognition accuracy of the exposure machine;

widths of the plurality of strip-shaped shading regions are gradually decreased in a direction away from the shading pattern region, and a width of the strip-shaped shading region closest to the shading pattern region is not greater than the minimum recognition accuracy of the exposure machine.

By adopting the technical solutions of the foregoing embodiments of the present disclosure, the signal transmission performance between the touch cover plate and the organic light-emitting backplane can be improved, and touch sensitivity can be improved.

Further features of the present disclosure and advantages thereof will become apparent from the following detailed description of exemplary embodiments with reference to the accompanying drawings.

BRIEF DESCRIPTION OF THE DRAWINGS

The accompanying drawings, which constitute a part of the specification, illustrate the embodiments of the present disclosure and, together with the description, serve to explain the principles of the present disclosure.

The present disclosure will be understood more clearly according to the following detailed description with reference to the accompanying drawings.

Please be appreciated that, the sizes of various portions shown in the accompanying drawings are not drawn to actual scale. Furthermore, identical or similar reference numerals are used to refer to identical or similar members.

DETAILED DESCRIPTION

Various exemplary embodiments of the present disclosure will be described in detail with reference to the accompanying drawings in the following. The following description of the exemplary embodiments is merely illustrative in nature and is in no way intended to limit this disclosure, its application, or uses. The present disclosure may be implemented in many different forms and is not limited to the embodiments described herein. These embodiments are provided merely for making the present disclosure thorough and complete, and sufficiently expressing the scope of the present disclosure to one of ordinary skill in the art. It should be noted that the relative arrangement of the components and steps set forth in these embodiments are interpreted to be merely illustrative instead of restrictive, unless it is specifically stated otherwise.

The words "first", "second" and the like used in the present disclosure do not imply any sequence, number or importance, but are merely used to distinguishing different portions. The word "comprise" or the like means that an element preceding the word covers elements listed following the word, but does not preclude the possibility of covering also other elements. The terms "up", "down", "left", "right" and the like are merely used for implying relative position relations, and after an absolute position of the object described changes, the relative position relation may possibly change correspondingly.

In this disclosure, when a specific device is described between a first device and a second device, an intermediate device may exist between the specific device and the first device or the second device, or an intermediate device may not exist.

All terms (including technical or scientific terms) used in this disclosure have the same meanings as understood by one of ordinary skill in the art, unless otherwise specifically defined. It should also be understood that the terms defined in common dictionaries should be interpreted as having meanings consistent with their meanings in the context of the related art, but should not be interpreted with idealized or extremely formalized meanings, unless otherwise expressly defined herein.

Techniques, methods and apparatus as known by one of ordinary skill in the relevant art may not be discussed in detail, but are intended to be regarded as a part of the specification where appropriate.

Figure 1:
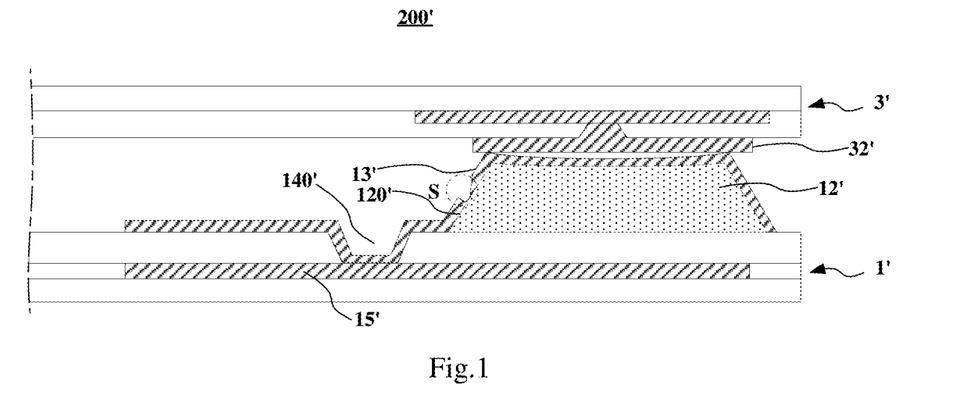
FIG. 1 is a schematic cross-sectional view of a touch display screen in a non-display region in the related art.

As shown in FIG. 1, the incell in the related art comprises an organic light-emitting backplane 1' and a touch cover plate 3' stacked together. In a non-display region 200', the organic light-emitting backplane 1' is provided with a padding layer 12' and a first wiring layer 13' at least a part of which is padded by the padding layer 12', the touch cover plate 3' is provided with a third wiring layer 32' on a side close to the organic light-emitting backplane 1', and the third wiring layer 32' is in conductive contact with the part of the first wiring layer 13' padded by the padding layer 12', so as to realize signal transmission between the touch cover plate 3' and the organic light-emitting backplane 1'.

The inventors of the present application found in the process of implementing the embodiments of the present disclosure that, in the incell in the related art, the signal transmission between the touch cover plate and the organic light-emitting backplane is unreliable, resulting in poor touch sensitivity.

In order to solve technical problems in the related art, the embodiments of the present disclosure provide an organic light-emitting backplane and a manufacturing method thereof, a touch display screen, and a touch display device.

Figure 2:
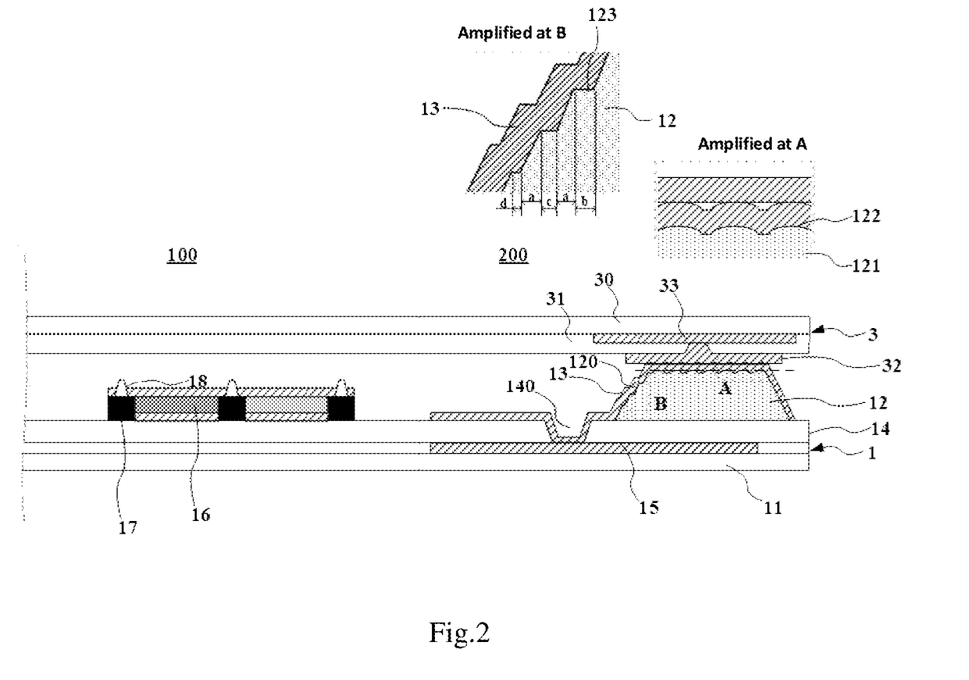
FIG. 2 is a schematic partial cross-sectional view of a touch display screen according to an embodiment of the disclosure.

As shown in FIG. 2, an organic light-emitting backplane 1 according to an embodiment of the present disclosure is applied to an incell. The organic light-emitting backplane 1 comprises a display region 100 and a non-display region 200 around the display region 100, and the organic light-emitting backplane 1 in the non-display region 200 comprises:

a first substrate 11;

a padding layer 12 located on a side of the first substrate 11, the padding layer 12 comprising a body portion 121 and a convex pattern portion 122 on a side of the body portion 121 away from the first substrate 11; and a first wiring layer 13 located on a side of the padding layer 12 away from the first substrate 11, wherein at least a part of the first wiring layer 13 is formed on a surface of the convex pattern portion 122.

The padding layer 12 is configured to pad at least a part of the first wiring layer 13, such that when the organic light-emitting backplane 1 and the touch cover plate 3 are stacked, the part of the first wiring layer 13 formed on the surface of the convex pattern portion 122 can be in electrical contact with a third wiring layer 32 on the touch cover plate 3, so as to realize signal transmission between the touch cover plate 3 and the organic light-emitting backplane 1.

The inventors of the present application found that, when the film layer is larger in both thickness and area, the surface appearance of the film layer tends to be concave, whereas when the film layer is larger in thickness and smaller in area, the surface appearance of the film layer tends to be convex. In the related art, as shown in FIG. 1, the overall surface appearance of the padding layer 12' is concave exactly due to the fact that the padding layer 12' is larger in both thickness and area. The overall surface appearance of the padding layer 12' is concave, resulting in poor flatness of the part of the first wiring layer 13' padded by the padding layer 12', and thus a larger contact resistance with the third wiring layer 32' of the touch cover plate 3', which seriously affects the signal transmission between the touch cover plate 3' and the organic light-emitting backplane 1'.

In the embodiment of the present disclosure, a convex pattern portion 122 is designed on a side of the padding layer 12 away from the first substrate 11, and the convex pattern portion 122 slightly protrudes from the body portion 121 of the padding layer 12, which is equivalent to the design of a plurality of small-area structures on the surface of the padding layer 12, and each small-area structure has a convex surface due to a small area, so that, as a whole, the surface appearance of the padding layer 12 is no longer concave, but rather is flat, as shown by the dashed lines in FIG. 2. The relatively flat surface of the padding layer 12 can ensure the contact area between the first wiring layer 13 and the third wiring layer 32 of the touch cover plate 3, thereby guaranteeing reliability of the signal transmission and improving the touch sensitivity.

As shown in FIG. 2, the organic light-emitting backplane 1 in the non-display region 200 further comprises: a second wiring layer 15 and a planarization layer 14 located between the first substrate 11 and the padding layer 12 and sequentially arranged in a direction away from the first substrate 11, and the first wiring layer 13 is electrically connected with the second wiring layer 15 through a cross section 120 of the padding layer 12 and a via 140 of the planarization layer 14. The planarization layer 14 is formed in both the display region 100 and the non-display region 200. By means of the via 140 of the planarization layer 14, the first wiring layer 13 and the second wiring layer 15 are electrically connected.

Since the padding layer 12 is patterned and has a certain thickness, the cross section 120 of the padding layer 12 can be understood as: side surfaces of the padding layer 12 connecting the top and bottom surfaces. The cross section 120 of the padding layer 12 is formed during its patterning process, for example, after an etching process or a developing process.

In one embodiment, as shown in FIG. 2, the planarization layer 14 further extends to the display region 100, and the organic light-emitting backplane 1 in the display region 100 comprises: an organic light-emitting device 16 located on a side of the planarization layer 14 away from the first substrate 11, a pixel defining layer 17 configured to space adjacent organic light-emitting devices 16 apart, and a spacer 18 located on a side of the pixel defining layer 17 away from the first substrate 11; a height of the padding layer 12 is not less than a sum of thicknesses of the pixel defining layer 17 and the spacer 18.

When the organic light-emitting backplane 1 is manufactured, an anode of the organic light-emitting device 16 is formed first on the planarization layer 14, then the pixel defining layer 17 and the spacer 18 are formed, and then other layer structures of the organic light-emitting device 16 are formed on the anode by evaporation. The spacer 18 is used to support the evaporation mask plate, so as to keep a certain distance between the evaporation mask plate and the manufactured layers. As can be seen from the figure, the pixel defining layer 17 and the spacer 18 have a certain protrusion height in the display region 100, and the padding layer 12 in the non-display region 200 can compensate for a structural thickness difference between the non-display region 200 and the display region 100, so that the first wiring layer 13 can be electrically contacted with the third wiring layer 32 of the touch cover plate 3.

In the embodiments of the present disclosure, specific materials of the first wiring layer 13 and the second wiring layer 15 are not limited. In some embodiments, the second wiring layer 15 may be made of the same material as the data lines (not shown) in the display region 100 and fabricated in the same patterning process. The first wiring layer 13 may be made of the same anode material as the organic light-emitting device 16 of the display region 100 and fabricated in the same patterning process.

In the embodiments of the present disclosure, a specific structural form of the convex pattern portion 122 is not limited, and may be, for example, an integral connecting structure, or include a plurality of convex substructures spaced apart from each other. Regardless of which structural form is adopted, the convex pattern portion 122 should be uniformly distributed on the surface of the padding layer 12.

Figure 3A:
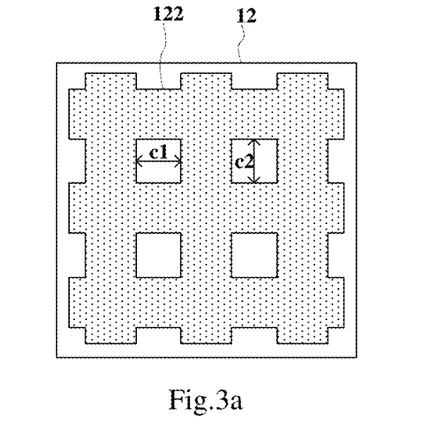
FIGS. 3a-3f are top views of a padding layer in some embodiments of the present disclosure.
Figure 3B:
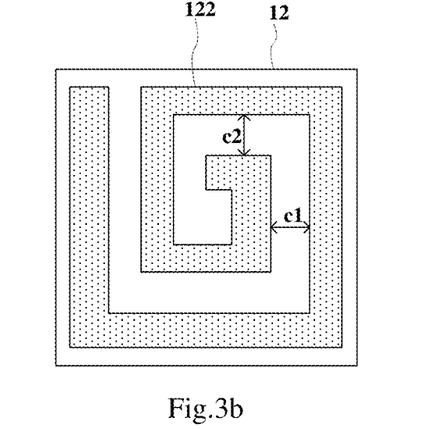
Figure 3C:
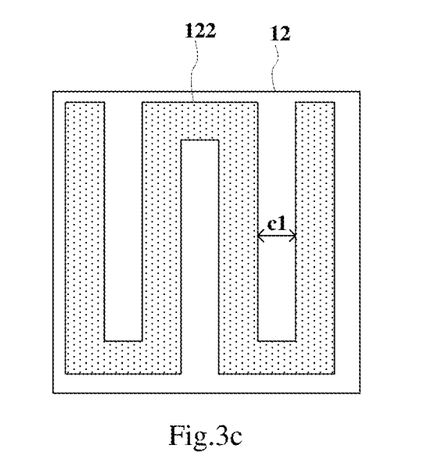

In some embodiments of the present disclosure, the convex pattern portion 122 is an integral connecting structure, for example, in a grid shape as shown in FIG. 3a, or in a coil shape as shown in FIG. 3b, or in a meander shape as shown in FIG. 3c.

Figure 3D:
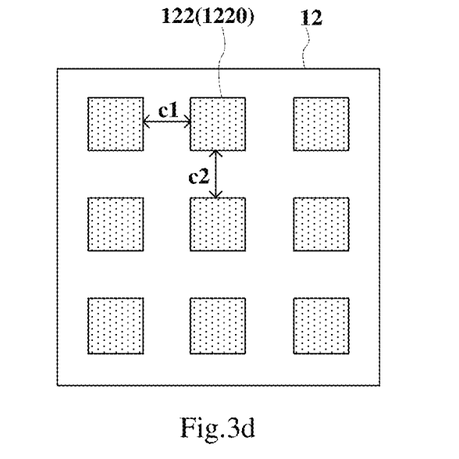
Figure 3E:
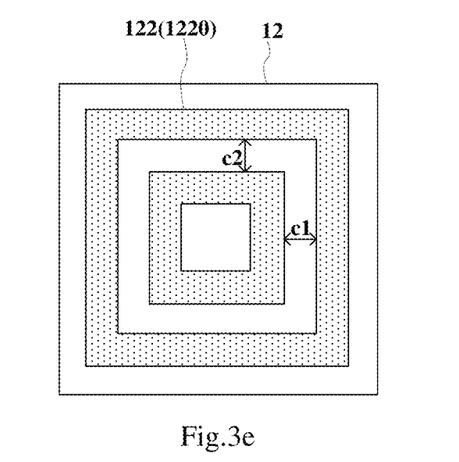
Figure 3F:
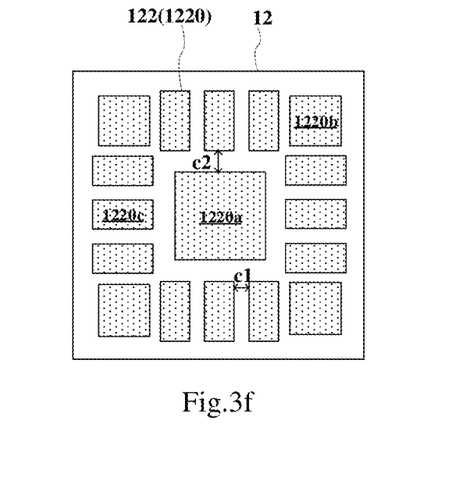

As shown in FIGS. 3d, 3e, and 3f, in some other embodiments of the present disclosure, the convex pattern portion 122 includes a plurality of convex substructures 1220 spaced apart, and the plurality of convex substructures 1220 may be arranged in an array as shown in FIG. 3d or in a concentric nested arrangement as shown in FIG. 3e.

In one embodiment, as shown in FIG. 3f, the plurality of convex substructures 1220 comprises: a first convex substructure 1220a located in a center of a virtual square, a second convex substructure 1220b located at four vertices of the virtual square, respectively, and a plurality of third convex substructures 1220c arranged along four sides of the virtual square, wherein a projected area S1 of the first convex substructure 1220a on the first substrate 11, a projected area S2 of the second convex substructure 1220b on the first substrate 11, and a projected area S3 of the third convex substructure 1220c on the first substrate 11 satisfy S1>S2>S3.

In the embodiments of the present disclosure, the padding layer 12 may include an organic material, such as a photoresist material, and is formed by exposure through a mask plate and development after the exposure. A gap size (gap sizes c1, c2 as shown in FIGS. 3a to 3f) of the convex pattern portion 122 is smaller than a minimum recognition accuracy of the exposure machine.

Figure 4:
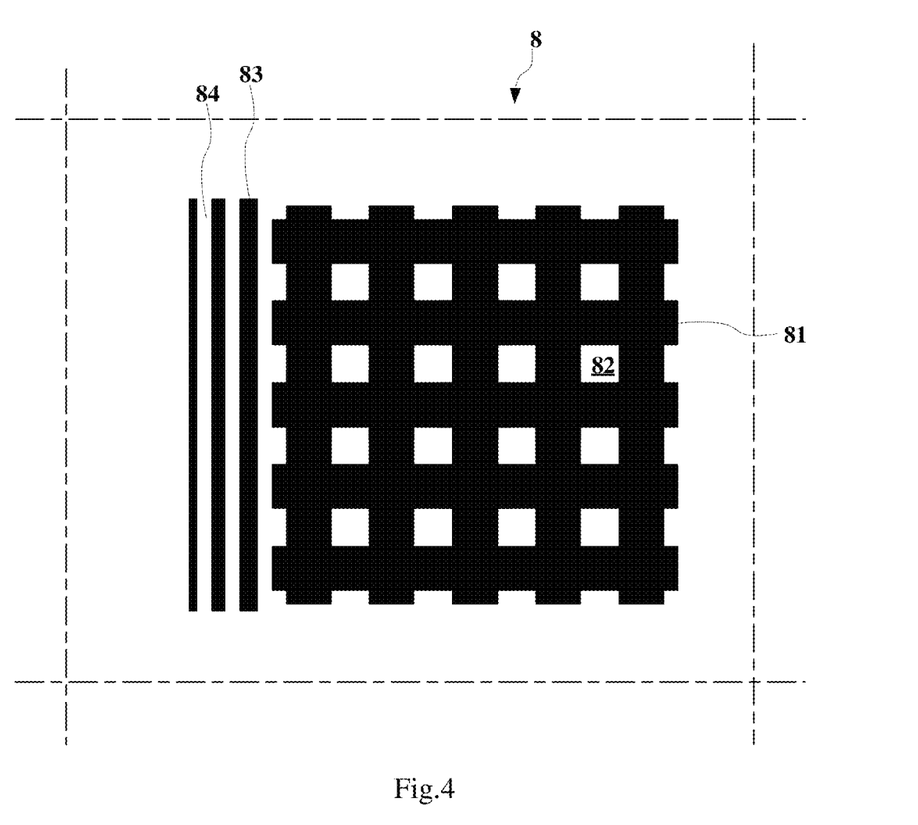
FIG. 4 is a partial top view of a mask plate for fabricating the padding layer in an embodiment of the present disclosure.

In one embodiment of the present disclosure, as shown in FIG. 4, the mask plate 8 for fabricating the padding layer 12 includes a shading pattern region 81 having the same pattern as the aforementioned convex pattern portion 122, and an aperture region 82 coupled to the shading pattern region 81, and an aperture width of the aperture region 82 is smaller than the minimum recognition accuracy of the exposure machine. Since the aperture width of the aperture region 82 of the mask plate 8 is smaller than the minimum recognition accuracy of the exposure machine, the aperture region 82 is exposed only slightly, and the convex pattern portion 122 is formed to protrude slightly beyond the body portion 121 of the padding layer 12 without forming a larger step with the body portion 121.

As shown in FIG. 2, in one embodiment of the present disclosure, the first wiring layer 13 is electrically connected to the second wiring layer 15 through the cross section 120 of the padding layer 12 and the via 140 of planarization layer 14, and the cross section 120 of the padding layer 12 is sloped and includes at least one step surface 123.

In the related art, as shown in FIG. 1, the cross section 120' of the padding layer 12' has a continuous slope shape. Because the padding layer 12' is larger in thickness, the first wiring layer 13' must pass through the relatively steep sloped cross section 120' and the via 140' to be electrically connected with the second wiring layer 15' during film formation, and therefore, the part of the first wiring layer 13' located on the sloped cross section 120' forms a thinner film, and is often broken (as shown at S in the figure), thereby affecting reliability of the electrical connection between the first wiring layer 13' and the second wiring layer 15'.

In the technical solution of the embodiments of the present disclosure, the cross section 120 of the padding layer 12 is sloped and includes at least one step surface 123. As can be seen by comparing FIG. 2 and FIG. 1, according to the embodiments of the present disclosure, the cross section 120 of the padding layer 12 is split by the design of the step surface 123, and the slope of the cross section 120 can be reduced as a whole, which is beneficial to increasing the film formation thickness of the first wiring layer 13 on the cross section 120, so that the broken condition of the first wiring layer is improved, and the reliability of the electrical connection between the first wiring layer 13 and the second wiring layer 15 is improved.

In some embodiments of the present disclosure, the cross section 120 of the padding layer 12 is sloped and includes at least two step surfaces 123, and a gap a of orthographic projections of any adjacent step surfaces 123 on the first substrate 11 is equal and smaller than the minimum recognition accuracy of the exposure machine; widths of the at least two step faces 123 are sequentially decreased in a direction close to the via 140, and a width of the step surface 123 farthest from the via 140 is not greater than the minimum recognition accuracy of the exposure machine.

In this embodiment, the cross section 120 of the padding layer 12 is provided with three step surfaces 123, a gap a of orthographic projections of any adjacent step surfaces 123 on the first substrate 11 is equal and smaller than the minimum recognition accuracy of the exposure machine, and widths of the three step surfaces are b, c and d respectively in a direction close to the via 140, wherein b>c>d, and b is equal to the minimum recognition accuracy of the exposure machine.

As shown in FIG. 4, the mask plate 8 for fabricating the padding layer further includes a plurality of strip-shaped shading regions 83 and a plurality of strip-shaped aperture regions 84 alternately arranged in a direction away from the shading pattern region 81, wherein aperture widths of the strip-shaped aperture regions 84 are equal and smaller than the minimum recognition accuracy of the exposure machine; widths of the plurality of strip-shaped shading regions 83 are gradually decreased in a direction away from the shading pattern region 81, and a width of the strip-shaped shading region 83 closest to the shading pattern region 81 is not greater than the minimum recognition accuracy of the exposure machine.

In this embodiment, the plurality of strip-shaped shading regions 83 and the plurality of strip-shaped aperture regions 84 arranged alternately form a stripe slit structure. The aperture widths of the plurality of strip-shaped shading regions 83 are gradually decreased along the direction away from the shading pattern region 81, and are not greater than the minimum recognition accuracy of the exposure machine, so that the regions of the mask plate become illumination unsaturated regions, the material of the padding layer is incompletely exposed, and finally the cross section 120 including the step surfaces 123 of the padding layer 12 in FIG. 2 is formed.

In conclusion, the incell adopts the organic light-emitting backplane designed according to the embodiments of the disclosure, so that the reliability of the signal transmission between the touch cover plate and the organic light-emitting backplane can be improved, and the touch sensitivity can be improved.

Referring to FIG. 2, the embodiments of the present disclosure further provide a touch display screen, comprising the organic light-emitting backplane 1 according to any of the foregoing embodiments, and a touch cover plate 3 stacked on the organic light-emitting backplane 1, wherein the touch cover plate 3 comprises a third wiring layer 32 electrically contacting with the part of the first wiring layer 13 formed on the surface of the convex pattern portion 122.

As shown in FIG. 2, in an embodiment of the present disclosure, the touch cover plate 3 comprises a second substrate 30, and a fourth wiring layer 33, an insulating layer 31, and the third wiring layer 32 arranged on a side of the second substrate 30 close to the organic light-emitting backplane 1 and sequentially arranged in a direction close to the organic light-emitting backplane 1, wherein the third wiring layer 32 and the fourth wiring layer 33 are electrically connected through a via.

The touch cover plate 3 may be a mutual-capacitance type touch cover plate or a self-capacitance type touch cover plate.

Based on the above analysis of the embodiments, the signal transmission between the touch cover plate 3 and the organic light-emitting backplane 1 of the incell is more reliable, and therefore, the touch sensitivity is better.

Figure 5:
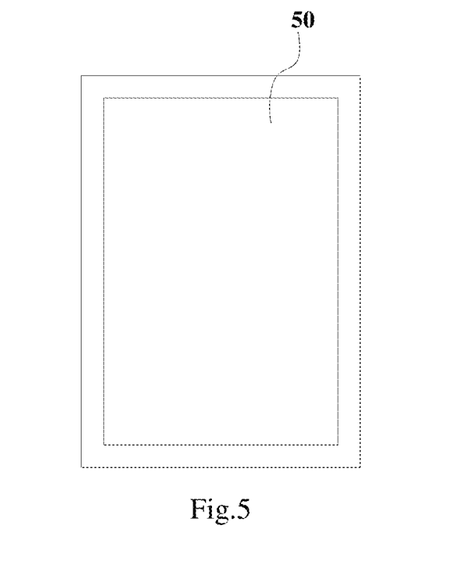
FIG. 5 is a front view of a touch display device according to an embodiment of the disclosure.

As shown in FIG. 5, the embodiments of the present disclosure further provide a touch display device comprising the touch display screen 50 according to the foregoing embodiment. The touch sensitivity of the touch display device is better. The specific product type of the touch display device is not limited, and may be, for example, a mobile phone, a tablet computer, a wearable device, a vehicle-mounted navigator, and the like.

Figure 6:
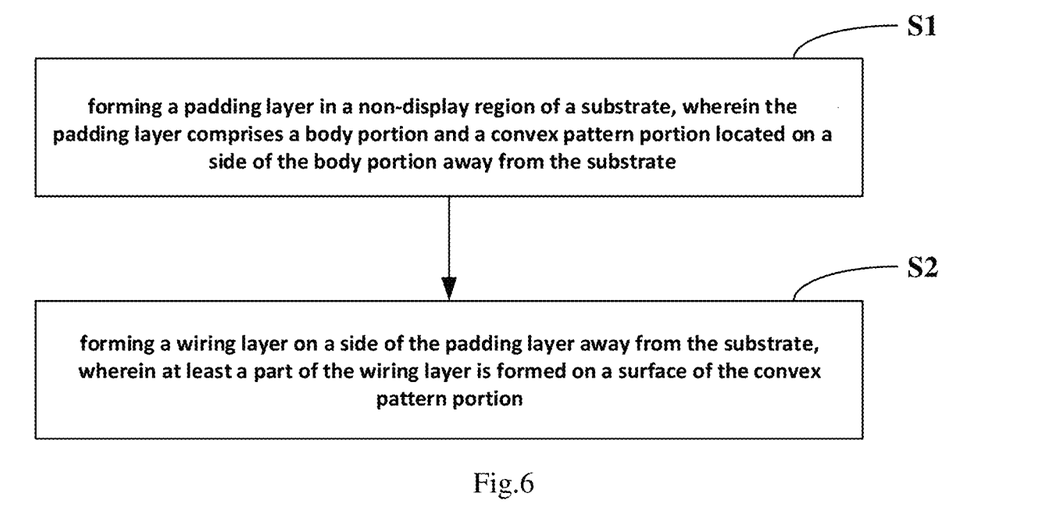
FIG. 6 is a flowchart of a method of manufacturing an organic light-emitting backplane according to an embodiment of the disclosure.

As shown in FIG. 6, the embodiments of the present disclosure further provide a method of manufacturing an organic light-emitting backplane, comprising the following steps:

step S1: forming a padding layer in a non-display region of a substrate, wherein the padding layer comprises a body portion and a convex pattern portion located on a side of the body portion away from the substrate; and step S2: forming a wiring layer on a side of the padding layer away from the substrate, wherein at least a part of the wiring layer is formed on a surface of the convex pattern portion.

As compared with the prior art, the organic light-emitting backplane manufactured by the manufacturing method according to the embodiments of the present disclosure is applied to an incell, in which the signal transmission between the touch cover plate and the organic light-emitting backplane is more reliable, and therefore the touch sensitivity is better.

Figure 7:
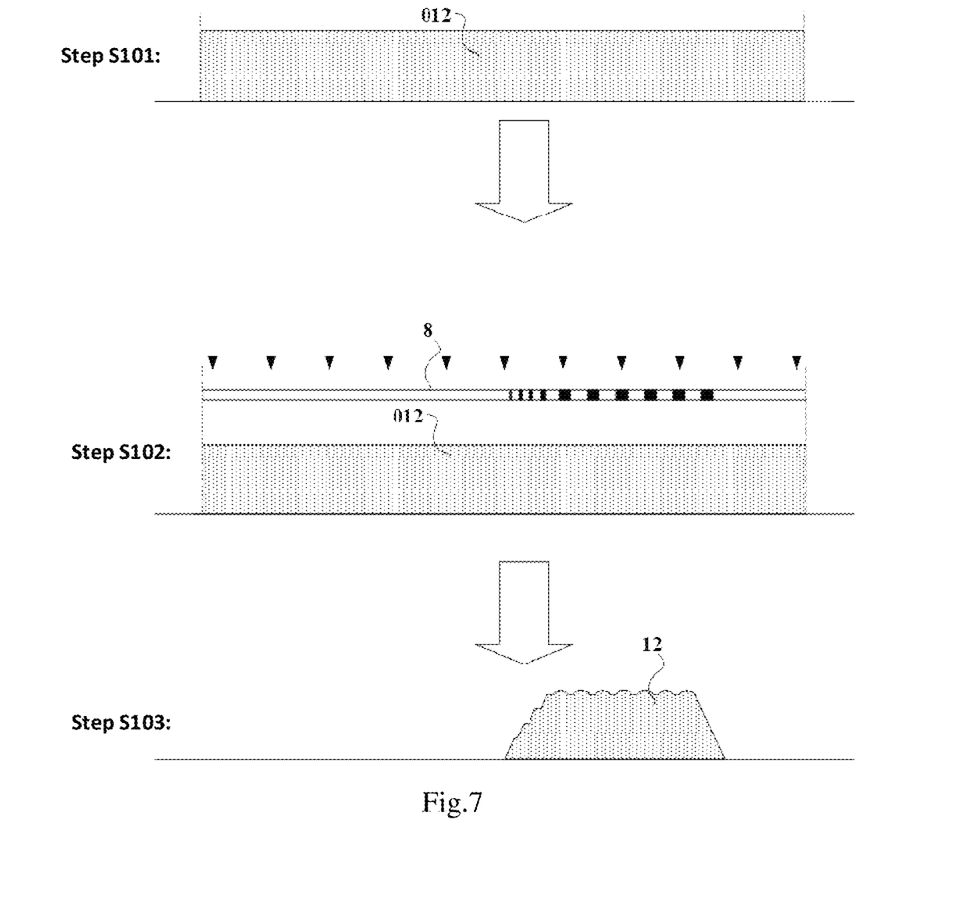
FIG. 7 is a schematic diagram illustrating steps for fabricating the padding layer according to an embodiment of the present disclosure.

Referring to FIG. 7, the step S1 may include the following sub-steps:

S101: forming an organic material film layer 012 on a side of the substrate;

s102: exposing the organic material film layer by using a mask plate 8;

s103: developing the exposed organic material film layer to form the padding layer 12.

Referring to FIG. 4, the mask plate 8 includes a shading pattern region 81 having the same pattern as the convex pattern portion 122 in FIG. 2, and an aperture region 82 coupled to the shading pattern region 81, an aperture width of the aperture region 82 being smaller than the minimum recognition accuracy of the exposure machine. Further, the mask plate 8 further includes a plurality of strip-shaped shading regions 83 and a plurality of strip-shaped aperture regions 84 alternately arranged in a direction away from the shading pattern region 81, aperture widths of the strip-shaped aperture regions 84 are equal and smaller than the minimum recognition accuracy of the exposure machine; widths of the plurality of strip-shaped shading regions 83 are gradually decreased in a direction away from the shading pattern region 81, and a width of the trip-shaped shading region 83 closest to the shading pattern region 81 is not greater than the minimum recognition accuracy of the exposure machine.

With the use of the above structural design of the mask plate, the final structure of the padding layer can be formed through one-time exposure and development after the exposure, the process is simple and convenient, and the cost is lower.

Although some specific embodiments of the present disclosure have been described in detail with examples, it should be understood by a person skilled in the art that the above examples are only intended to be illustrative but not to limit the scope of the present disclosure. The above embodiments can be modified without departing from the scope and spirit of the present disclosure. The scope of the present disclosure is defined by the attached claims.

What is claimed is:

1. An organic light-emitting backplane comprising a display region and a non-display region located around the display region, the organic light-emitting backplane in the non-display region comprising:

a first substrate;

a padding layer located on a side of the first substrate, the padding layer comprising a body portion and a convex pattern portion located on a side of the body portion away from the first substrate;

a first wiring layer located on a side of the padding layer away from the first substrate, at least a part of the first wiring layer being formed on a surface of the convex pattern portion; and a second wiring layer and a planarization layer located between the first substrate and the padding layer and sequentially arranged in a direction away from the first substrate, and the first wiring layer is eclectically connected with the second wiring layer through a cross section of the padding layer and a via of the planarization layer.

2. The organic light-emitting backplane according to claim 1, wherein the convex pattern portion is an integral connecting structure, or the convex pattern portion comprises a plurality of convex substructures spaced apart.

3. The organic light-emitting backplane according to claim 1, wherein the convex pattern portion is in the form of a grid, a coil, or a meander.

4. The organic light-emitting backplane according to claim 1, wherein the convex pattern portion comprises a plurality of convex substructures spaced apart, the plurality of convex substructures are arranged in an array, or the plurality of convex substructures are arranged in a concentric nested manner, or the plurality of convex substructures comprises: a first convex substructure located in a center of a virtual square, a second convex substructure located at four vertexes of the virtual square respectively, and a plurality of third convex substructures arranged along four sides of the virtual square, wherein a projected area S1 of the first convex substructure on the first substrate, a projected area S2 of the second convex substructure on the first substrate, and a projected area S3 of the third convex substructure on the first substrate satisfy S1>S2>S3.

5. The organic light-emitting backplane according to claim 1, wherein a gap size of the convex pattern portion is less than a minimum recognition accuracy of an exposure machine.

6. The organic light-emitting backplane according to claim 1, wherein the cross section of the padding layer is sloped and includes at least one step surface.

7. The organic light-emitting backplane according to claim 1, wherein the cross section of the padding layer is sloped and includes at least two step surfaces, and a gap of orthographic projections of any adjacent step surfaces on the first substrate is equal and less than the minimum recognition accuracy of the exposure machine;

widths of the at least two step surfaces are sequentially decreased in a direction close to the via, and a width of the step surface farthest from the via is not greater than the minimum recognition accuracy of the exposure machine.

8. The organic light-emitting backplane according to claim 1, wherein the planarization layer further extends to the display region, and the display region includes: an organic light-emitting device located on a side of the planarization layer away from the first substrate, a pixel defining layer configured to space adjacent organic light-emitting devices apart, and a spacer located on a side of the pixel defining layer away from the first substrate;

a height of the padding layer is not less than a sum of thicknesses of the pixel defining layer and the spacer.

9. The organic light-emitting backplane according to claim 1, wherein a material of the padding layer includes an organic material.

10. A touch display screen, comprising the organic light-emitting backplane according to claim 1, and a touch cover plate stacked on the organic light-emitting backplane, wherein the touch cover plate comprises a third wiring layer in electrical contact with the part of the first wiring layer formed on the surface of the convex pattern portion.

11. A touch display device, comprising the touch display screen according to claim 10.

12. The touch display screen according to claim 10, wherein
the convex pattern portion is an integral connecting structure, or the convex pattern portion comprises a plurality of convex substructures spaced apart.

13. The touch display screen according to claim 10, wherein
the convex pattern portion is in the form of a grid, a coil, or a meander.

14. The touch display screen according to claim 10, wherein
the convex pattern portion comprises a plurality of convex substructures spaced apart, the plurality of convex substructures are arranged in an array, or the plurality of convex substructures are arranged in a concentric nested manner, or
the plurality of convex substructures comprises: a first convex substructure located in a center of a virtual square, a second convex substructure located at four vertexes of the virtual square respectively, and a plurality of third convex substructures arranged along four sides of the virtual square, wherein a projected area S1 of the first convex substructure on the first substrate, a projected area S2 of the second convex substructure on the first substrate, and a projected area S3 of the third convex substructure on the first substrate satisfy S1>S2>S3.

15. The touch display screen according to claim 10, wherein a gap size of the convex pattern portion is less than a minimum recognition accuracy of an exposure machine.

16. A method of manufacturing an organic light-emitting backplane, comprising:

forming a first wiring layer on a substrate;
forming a planarization layer on the first wiring layer;
forming a padding layer on the planarization layer in a non-display region of the substrate, wherein the padding layer comprises a body portion and a convex pattern portion located on a side of the body portion away from the substrate; and
forming a second wiring layer on a side of the padding layer away from the substrate, wherein at least a part of the second wiring layer is formed on a surface of the convex pattern portion;
wherein the first wiring layer and the planarization layer are located between the substrate and the padding layer and sequentially arranged in a direction away from the substrate, and the second wiring layer is electrically connected with the first wiring layer through a cross section of the padding layer and a via of the planarization layer.

17. The method of manufacturing according to claim 16, wherein that forming a padding layer on the planarization layer in a non-display region of a substrate comprises:
forming an organic material film layer on a side of the substrate;
exposing the organic material film layer by using a mask plate;
developing the exposed organic material film layer to form the padding layer;
wherein, the mask plate comprises a shading pattern region with a same pattern as the convex pattern portion and an aperture region coupled with the shading pattern region, and an aperture width of the aperture region is smaller than a minimum recognition accuracy of an exposure machine.

18. The method of manufacturing according to claim 17, wherein
the mask plate further comprises a plurality of strip-shaped shading regions and a plurality of strip-shaped aperture regions alternately arranged in a direction away from the shading pattern region, wherein:
aperture widths of the strip-shaped aperture regions are equal and smaller than the minimum recognition accuracy of the exposure machine;
widths of the plurality of strip-shaped shading regions are gradually decreased in a direction away from the shading pattern region, and a width of the strip-shaped shading region closest to the shading pattern region is not greater than the minimum recognition accuracy of the exposure machine.

* * * * *

UNITED STATES PATENT AND TRADEMARK OFFICE
CERTIFICATE OF CORRECTION

PATENT NO. : 11,393,895 B2
APPLICATION NO. : 16/973963
DATED : July 19, 2022
INVENTOR(S) : Fei Yu et al.

Page 1 of 1

It is certified that error appears in the above-identified patent and that said Letters Patent is hereby corrected as shown below:

On the Title Page

Column 2, Item (57) Abstract, Line 12, Delete "apart" and insert -- a part --

In the Claims

Column 10, Line 12, Claim 1, delete "eclectically" and insert -- electrically --

Signed and Sealed this
Twentieth Day of September, 2022

Katherine Kelly Vidal
*Director of the United States Patent and Trademark Office*